(12) United States Patent
Zhu

(10) Patent No.: US 9,825,135 B2
(45) Date of Patent: Nov. 21, 2017

(54) SEMICONDUCTOR DEVICES AND METHODS FOR MANUFACTURING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 15/424,642

(22) Filed: Feb. 3, 2017

(65) Prior Publication Data

US 2017/0148881 A1    May 25, 2017

Related U.S. Application Data

(62) Division of application No. 14/402,304, filed as application No. PCT/CN2013/082534 on Aug. 29, 2013, now abandoned.

(30) Foreign Application Priority Data

Aug. 13, 2013   (CN) .......................... 2013 1 0351422

(51) Int. Cl.
*H01L 29/40*     (2006.01)
*H01L 29/66*     (2006.01)
*H01L 21/768*    (2006.01)

(52) U.S. Cl.
CPC ...... *H01L 29/401* (2013.01); *H01L 21/76897* (2013.01); *H01L 29/6653* (2013.01);
(Continued)

(58) Field of Classification Search
None
See application file for complete search history.

(56) References Cited

U.S. PATENT DOCUMENTS

2002/0008793 A1* 1/2002 Takasugi ........... G02F 1/136204
                                                        349/40
2002/0146899 A1* 10/2002 Chun ................ H01L 21/76831
                                                        438/618

(Continued)

FOREIGN PATENT DOCUMENTS

| CN | 101295645 A | 10/2008 |
|---|---|---|
| CN | 102386081 A | 3/2012 |

(Continued)

*Primary Examiner* — Alexander Ghyka
(74) *Attorney, Agent, or Firm* — Christensen, Fonder, Dardi & Herbert

(57) ABSTRACT

Semiconductor devices and methods for manufacturing the same are provided. An example method may include: forming a sacrificial gate stack on a substrate; forming a gate spacer on sidewalls of the sacrificial gate stack; forming an interlayer dielectric layer on the substrate and planarizing it to expose the sacrificial gate stack; partially etching back the sacrificial gate stack to form an opening; expanding the resultant opening so that the opening is in a shape whose size gradually increases from a side adjacent to the substrate towards an opposite side away from the substrate; and removing a remaining portion of the sacrificial gate stack and forming a gate stack in a space defined by the gate spacer.

5 Claims, 12 Drawing Sheets

(52) U.S. Cl.
CPC .. *H01L 29/66545* (2013.01); *H01L 29/66568* (2013.01); *H01L 29/66803* (2013.01)

(56) References Cited

U.S. PATENT DOCUMENTS

| | | |
|---|---|---|
| 2011/0073920 A1 | 3/2011 | Heinrich et al. |
| 2012/0052647 A1 | 3/2012 | Kim et al. |
| 2012/0088359 A1* | 4/2012 | Kim ............... H01L 21/28114 438/589 |
| 2013/0017680 A1 | 1/2013 | Haran et al. |

FOREIGN PATENT DOCUMENTS

| | | |
|---|---|---|
| CN | 102486998 A | 6/2012 |
| CN | 102487013 A | 6/2012 |
| CN | 102881574 A | 1/2013 |
| CN | 102956454 A | 3/2013 |
| CN | 102956705 A | 3/2013 |
| CN | 103219368 A | 7/2013 |

\* cited by examiner (c)

(a)

(b)

SEMICONDUCTOR DEVICES AND METHODS FOR MANUFACTURING THE SAME

CROSS-REFERENCE TO RELATED APPLICATION(S)

This application is a divisional application claiming priority to U.S. patent application Ser. No. 14/402,304, filed Nov. 19, 2014, which application is a national phase application of PCT Application No. PCT/CN2013/082534, filed on Aug. 29, 2013, entitled "SEMICONDUCTOR DEVICES AND METHODS FOR MANUFACTURING THE SAME," which claimed priority to the Chinese Patent Application No. 201310351422.9, filed on Aug. 13, 2013, all of which are incorporated herein by reference in their entireties.

TECHNICAL FIELD

The present disclosure relates to the semiconductor field, and particularly, to semiconductor devices and methods for manufacturing the same.

BACKGROUND

With continuous scaling down of semiconductor devices, the conventional $SiO_2$/poly silicon gate configuration is gradually being replaced with the high-K gate dielectric/metal gate configuration. Accordingly, the gate first process is gradually being replaced with the gate-last process.

In the gate last process, a sacrificial gate stack is used for device manufacture. Then, the sacrificial gate is removed and replaced with a real gate stack. However, a space left after removing the sacrificial gate stack is becoming smaller and smaller, so it becomes more and more difficult to fill the real gate stack into the space.

SUMMARY

The present disclosure aims to provide, among others, semiconductor devices and methods for manufacturing the same, by which it is possible to improve filling of a gate stack.

According to an aspect of the present disclosure, there is provided a method for manufacturing a semiconductor device. The method may comprise: forming a sacrificial gate stack on a substrate; forming a gate spacer on sidewalls of the sacrificial gate stack; forming an interlayer dielectric layer on the substrate and planarizing it to expose the sacrificial gate stack; partially etching back the sacrificial gate stack to form an opening; expanding the resultant opening so that the opening is in a shape whose size gradually increases from a side adjacent to the substrate towards an opposite side away from the substrate; and removing a remaining portion of the sacrificial gate stack and forming a gate stack in a space defined by the gate spacer.

According to another aspect of the present disclosure, there is provided a semiconductor device. The semiconductor device may comprise: a substrate; a gate stack formed on the substrate and a gate spacer on sidewalls of the gate stack, wherein a volume defined by the gate spacer is in a shape whose size gradually increases from a side adjacent to the substrate towards an opposite side away from the substrate at least in a portion of the volume on the side away from the substrate.

According to embodiments of the present disclosure, after removing the sacrificial gate stack, the space defined by the gate spacer may be expanded by, for example, atom or ion bombardment, especially to present a shape whose size gradually increases upwards, at least in its upper portion. It helps to improve the filling of the gate stack into the space.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1:
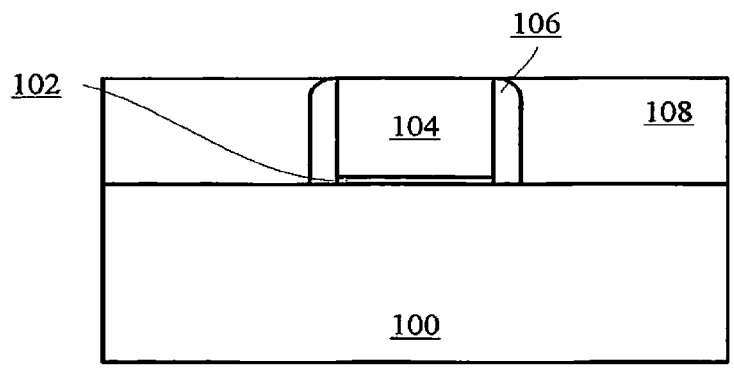
FIGS. 1 to 5 are schematic views showing a flow of manufacturing a semiconductor device according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to embodiments of the present disclosure, there is provided a semiconductor device. The semiconductor device may comprise a gate stack formed on a substrate and a gate spacer on sidewalls of the gate stack. A volume defined by the gate spacer is larger at a side away from the substrate than at an opposite side adjacent to the substrate. Thus, such a gate spacer defines (inside it) a space in which an upper portion is relatively large while a lower portion is relatively small (here, the side away from the substrate is referred to as the "upper" side and the side adjacent to the substrate is referred to as the "lower" side). Consequently, it is relatively easy for the gate stack to be filled into the space.

In an example, the volume defined by the gate spacer may have a size gradually increasing from the side adjacent to the substrate (e.g., the lower side) towards the side away from the substrate (e.g., the upper side), to present a dipper shape which is tapered downwards, at least in a portion of the volume on the side away from the substrate (e.g., the upper side). It is relatively easy to manufacture such a gate spacer.

The gate stack may comprise various appropriate configurations. For example, the gate stack may comprise a stack of a gate dielectric layer (e.g., a high-K gate dielectric layer) and a gate conductor layer (e.g., a metal gate conductor layer), and a work function adjustment layer may be formed between them. The gate stack may be used for a planar device such as MOSFET. In particular, the gate stack may be formed on an active region of the substrate so as to define a channel region in the active region. A source region and a drain region may be formed in the active region on opposite sides of the channel region. Alternatively, the gate stack may be used for a 3D device, such as a FinFET. In particular, the gate stack may intersect with a fin formed on the substrate so as to define a channel region in the fin. A source region and a drain region may be formed at ends of the fin on opposite sides of the channel region. In order to prevent leakage between the source and drain regions via the bottom of the fin, the semiconductor device may further comprise a punch-through-stopper (PTS) formed in a region beneath a portion of the fin intersecting with the gate stack (in particular, the channel region).

In an example, the gate stack does not fill up the volume defined by the gate spacer. For example, the gate conductor layer may be recessed with respect to an end of the gate spacer on the side away from the substrate (e.g., the upper end). The recessed gate conductor layer may be covered with a dielectric layer. In this situation, it is possible to improve the process margin for drain/source contacts.

According to other embodiments of the present disclosure, there is provided a method for manufacturing a semiconductor device, which is especially applicable to the gate last process. According to the gate last process, a sacrificial gate stack may be formed on a substrate and then the sacrificial gate stack may be used for device manufacture (e.g., to form a source region and a drain region). Subsequently, the sacrificial gate stack may be removed so as to leave a gate trench inside the gate spacer. Instead of directly filling a real gate stack into the gate trench, the gate spacer may be processed so that the gate trench is expanded at its upper portion. In this way, it is easier to fill the gate stack into the gate trench. In order to protect the active region or the fin during processing the gate spacer, the sacrificial gate stack may be partially removed prior to processing the gate spacer, and a remaining portion of the sacrificial gate stack may be removed after processing the gate spacer. The process for the gate spacer may be implemented by, for example, atom or ion bombardment. In an example, plasma sputtering may be employed.

The present disclosure can be presented in various ways, some of which will be illustrated in the following.

Figure 5:
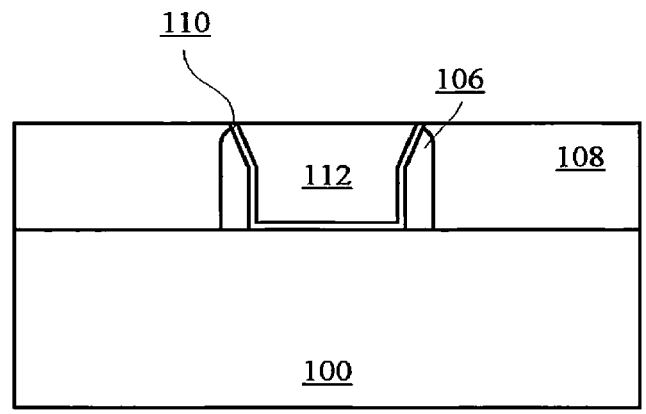

FIG. 5 is a schematic view showing a semiconductor device according to an embodiment of the present disclosure. As shown in FIG. 5, the semiconductor device may comprise a gate stack formed on a substrate 100. The gate stack may comprise a gate dielectric layer 110 and a gate conductor layer 112. In addition, the semiconductor device may further comprise a gate spacer 106 formed on sidewalls of the gate stack (in this example, the gate dielectric layer 110). The gate spacer 106 may be shaped so that a volume defined thereby (e.g., a volume inside the gate spacer; in this example, a volume occupied by the gate stack) is larger at a side away from the substrate than at an opposite side adjacent to the substrate. In this example, the volume looks like, in its upper portion, a dipper which is tapered downwards.

Furthermore, FIG. 5 also shows an interlayer dielectric layer 108 formed on the substrate 100. The interlayer dielectric layer 108 may have a top surface substantially flush with a top surface of the gate stack.

For example, the semiconductor device may be manufactured as follows.

In particular, as shown in FIG. 1, a substrate 100 is provided. The substrate 100 may comprise any suitable forms of substrates, e.g., a bulk semiconductor substrate such as Si, Ge or the like, a compound semiconductor substrate such as SiGe, GaAs, GaSb, AlAs, InAs, InP; GaN, SiC, InGaAs, InSb, InGaSb or the like, and an Insulator On Semiconductor (SOI) substrate. Herein, the bulk silicon substrate and silicon-based materials are described by way of example. It should be noted that the present disclosure is not limited thereto.

A sacrificial gate stack may be formed on the substrate 100. For example, a sacrificial gate dielectric 102 and a sacrificial gate conductor layer 104 may be formed in sequence by deposition. The sacrificial gate dielectric layer 102 may comprise oxide (e.g., $SiO_2$), and the sacrificial gate conductor layer 104 may comprise poly silicon. Then, the sacrificial gate dielectric layer 102 and the sacrificial gate conductor layer 104 may be patterned into a sacrificial gate stack by, e.g., photolithography. Halo and extension implantation may be performed with the sacrificial gate stack as a mask. Then, a gate spacer 106 may be formed on sidewalls of the gate stack. For example, the gate spacer 106 may be formed by depositing a conformal nitride layer (e.g., silicon nitride) on the substrate and selectively etching the nitride layer by, e.g., Reactive Ion Etching (RIE). Subsequently, source/drain implantation may be performed with the gate stack and the gate spacer 106 as a mask. Annealing may be performed to activate implanted ions to form source/drain regions (not shown).

In FIG. 1, the gate spacer 106 is shown in a single layer configuration. However, the present disclosure is not limited thereto. For example, the gate spacer 106 may comprise a configuration of two or more layers.

Subsequently, an interlayer dielectric layer 108 may be formed on the resultant structure. For example, the interlayer dielectric layer 108 may be formed by depositing oxide and then planarizing it by, for example, Chemical Mechanical Polishing (CMP). The planarizing may stop at the gate spacer 106, so as to expose the sacrificial gate stack.

Figure 2:
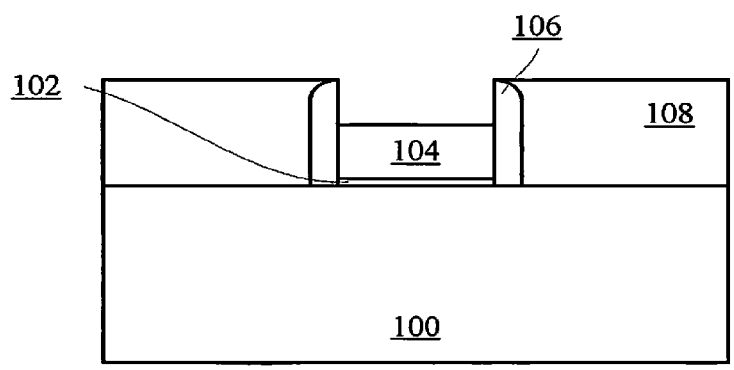

Subsequently, as shown in FIG. 2, the sacrificial gate stack (in this example, the sacrificial gate conductor layer 104) may be partially etched back by selective etching, such as ME. For example, the etching back may be performed to a depth of about 10 nm-60 nm. Thus, an opening is formed inside the gate spacer 106.

Figure 3:
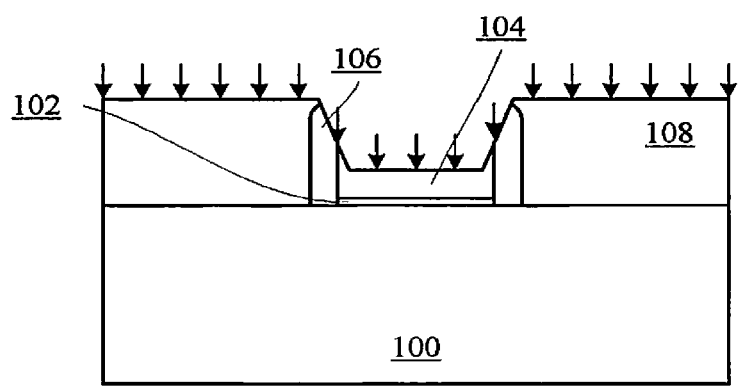

Next, as shown in FIG. 3 (referring to arrows shown in the figure), atom and/or ion bombardment, such as plasma sputtering, may be performed on a top surface of the structure shown in FIG. 2, to expand the opening. For example, plasma such as Ar, N or the like can be used for bombardment. Because of the morphology of the structure shown in FIG. 2 (recessed in the center) and loading conditions for the atom/ion bombardment caused by the morphology, the gate spacer may have at least an upper portion of its surface inclined, so that the inclined portion of the surface defines a spacer tapered downwards. When the bombardment is implemented in a substantially vertical direction, the expanded opening may be self-aligned to a remaining portion of the sacrificial gate stack. Therefore, it is possible to save an area occupied by the device and thus decrease the manufacture cost as compared with methods of expanding the opening not in a self-alignment way.

Here, the gate spacer 106 may have its height (in a case of a multiple-layer configuration, the height of the multiple-layer gate spacer as a whole) changed to a relatively small extent or even not changed. That is, the atom and/or ion bombardment can change the shape of the upper end surface of the gate spacer 106, while removing a little portion or almost substantially no portion from the upper end portion of the gate spacer 106 (in a case of a multiple-layer configuration, an inside layer of the gate spacer may have its upper end portion removed, while at least one or more outside layers may have its/their upper end portion(s) barely or substantially not removed, so that the whole height undergoes substantially no change while the upper end surface is inclined).

Figure 4:
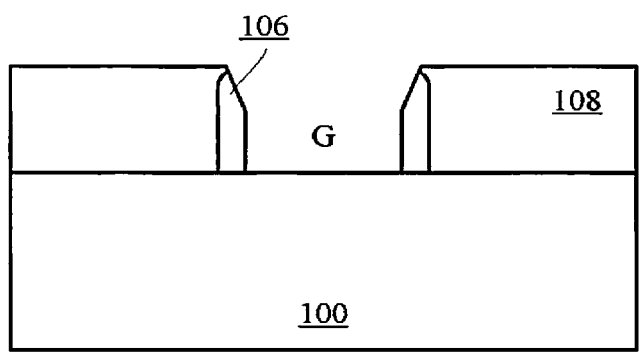

Subsequently, as shown in FIG. 4, the remaining portion of the gate stack (including a remaining portion of the sacrificial gate conductor layer 104 and the sacrificial gate dielectric layer 102) may be further removed by selective etching, such as RIE. Thus, a space G (also referred to as "gate trench") defined by the gate spacer 106 is left inside the gate spacer 106.

In the example shown in FIG. 4, the gate trench G is in a shape whose size gradually increases upwards at its upper portion. However, the present disclosure is not limited thereto. For example, the gate trench G may present a shape tapered from its top to its bottom (i.e., the surface of the substrate 100) in its entire height, if allowed by the gate spacer. Furthermore, the variation of the gate trench G in size is not limited to such a gradual variation. It is to be appreciated by those skilled in the art that it is relatively easy to fill a real gate stack into the gate trench G as long as the gate trench G is larger at its upper portion than at its lower portion. In addition, the upper end surface of the gate trench G is not limited to the incline in a linear form as shown in FIG. 4, and it may comprise fluctuations caused by the atom and/or ion bombardment and even may present an incline in a curved form.

Subsequently, as shown in FIG. 5, the gate stack may be filled into the gate trench G. For example, a gate dielectric layer 110 and a gate conductor layer 112 may be formed in sequence on the structure shown in FIG. 4 by deposition. For example, the gate dielectric layer 110 may comprise high-K dielectric such as HfO$_2$ or the like, with a thickness of about 0.5-3 nm. The gate conductor layer 112 may comprise a metal gate conductor such as TiAl, TiN or the like. Furthermore, the metal gate conductor layer 112 is not limited to a single layer configuration as shown in the figure, and may comprise a multiple-layer configuration. Since the gate trench is increased in size at its upper portion, it is relative easy to fill the gate stack into it.

Next, portions of the gate dielectric layer 110 and the gate conductor layer 112 outside the gate trench G may be removed by, for example, etching back, to form a gate stack. The etching back may stop at the spacer.

In the example shown in FIG. 5, the gate dielectric layer 110 and the gate conductor layer 112 are shown to fill up the gate trench G. However, the present disclosure is not limited thereto. For example, the metal gate conductor 112 may form to be thin so that the gate trench is not completely filled up. Afterwards, a poly silicon layer or a metal layer or the like may be further formed on the metal gate conductor 112 by, for example, deposition.

In an example, an interface layer (not shown) may be formed on the surface of the substrate 100 by deposition or thermal oxidation. The interface layer may comprise an oxide (e.g., silicon oxide) with a thickness of about 0.3-1.4 nm. The high-K gate dielectric layer may be formed on the interface layer.

It is to be noted that processes and parameters for the gate last process are not described in detail in the above description. Those skilled in the art may devise various suitable processes and parameters.

Figure 6:
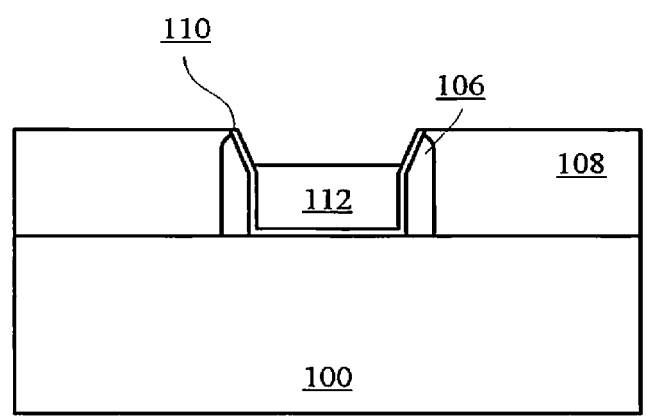
FIGS. 6 to 8 are schematic views showing a flow of manufacturing a semiconductor device according to another embodiment of the present disclosure.
Figure 7:
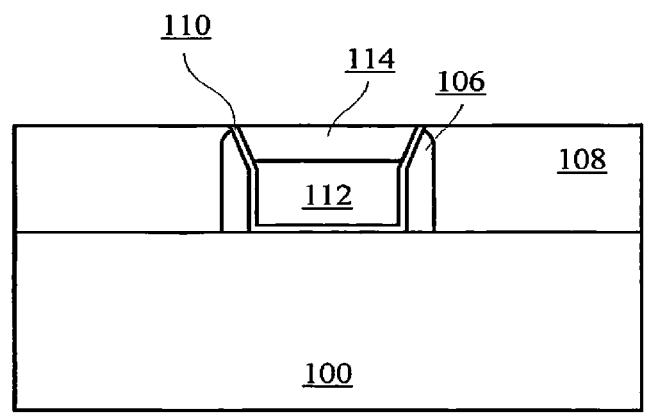

According to another embodiment of the present disclosure, after the structure shown in FIG. 5 is obtained, the gate conductor layer 112 may be further etched back, as shown in FIG. 6. For example, the gate conductor layer 112 after being etched back may have a height of about 10 nm-50 nm. Then, as shown FIG. 7, a dielectric layer 114 (e.g., nitride) may be filled into a space in the gate trench G caused by the etching back, to cover the gate conductor layer 112. FIG. 7 shows that the dielectric layer 114 is within the gate trench G. However, the dielectric layer 114 may further extend outside the gate trench G onto the interlayer dielectric layer 108.

Figure 8:
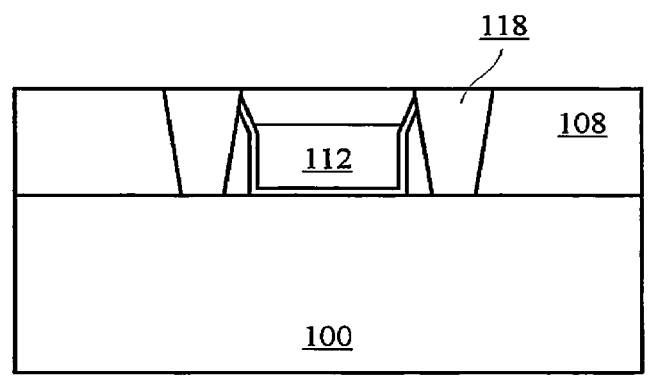

The configuration in FIG. 7 has an advantage of improving the process margin for source/drain contracts. For example, as shown in FIG. 8, in forming contacts 118 in the interlayer dielectric layer 108, the contacts 118 may be aligned to the source/drain regions in a relatively loose manner due to the presence of the dielectric layer 114. For example, in the example shown in FIG. 8, the contacts 118 have been offset to pass through the gate spacer 106. However, such an offset is disadvantageous in the structure shown in FIG. 5. In addition, the contacts 118 may be formed to be relatively large.

Figure 21:
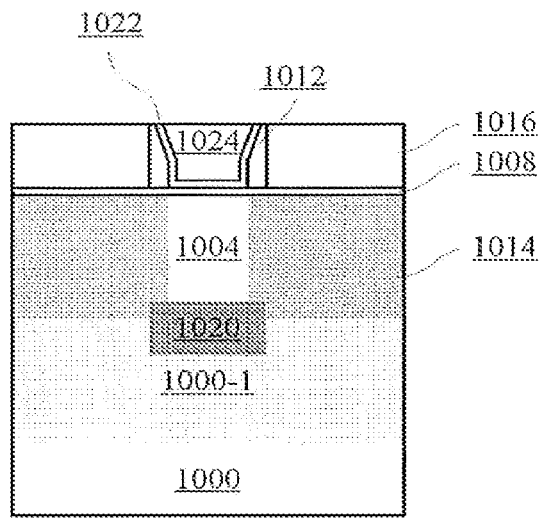

FIG. 21 is a schematic view showing a semiconductor device according to a further embodiment of the present disclosure. As shown in FIG. 21, the semiconductor device may comprise a fin 1004 formed on a substrate 1000 and a gate stack intersecting with the fin 1004 (referring to FIG. 15). The gate stack may comprise a gate dielectric layer 1022 and a gate conductor layer 1024. In addition, the semiconductor device may further comprise a gate spacer 1012 formed on sidewalls of the gate stack (in this example, the gate dielectric layer 1022). The gate stack may be isolated from the substrate by an isolation layer (referring to 1006 in FIG. 13). Likewise, the gate spacer 1012 may be shaped so that a volume defined thereby (e.g., a volume inside it; and in this example, a volume occupied by the gate stack) is larger at a side away from the substrate than at an opposite side adjacent to the substrate. In this example, the volume looks like, in its upper portion, a dipper which is tapered downwards.

The gate stack defines a channel region in the fin 1004. Source/drain regions 1014 may be formed in the fin 1004 on opposite sides of the channel region. In addition, a PTS 1020 may be formed beneath the channel region. In the example shown in FIG. 21, the device is formed on a well-region 1000-1 disposed in the substrate 1000.

For example, the semiconductor device may be manufactured as follows.

Figure 9:
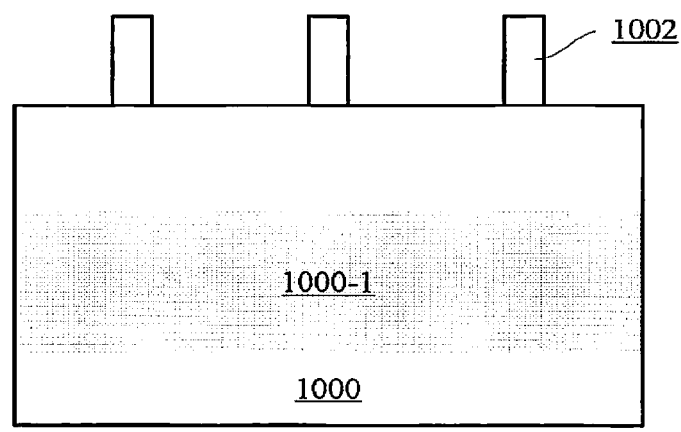
FIGS. 9 to 21 are schematic views showing a flow of manufacturing a semiconductor device according to a further embodiment of the present disclosure.

In particular, as shown in FIG. 9, a substrate 1000 is provided. The substrate 1000 may comprise any suitable forms of substrate, e.g., those described in conjunction with FIG. 1. According to some embodiments of the present disclosure, a well-region 1000-1 may be formed in the substrate 1000. For example, an n-type well region may be formed for a p-type device, and a p-type well region may be formed for an n-type device. For example, the n-type well region may be formed by implanting n-type impurities such as P or As to the substrate 1000, and the p-type well region may be formed by implanting p-type impurities such as B to the substrate 1000. If necessary, annealing may be performed after the implantation. Those skilled in the art may devise various ways to form the n-type well and the p-type well, and thus detailed descriptions thereof are omitted here for brevity.

Figure 10:
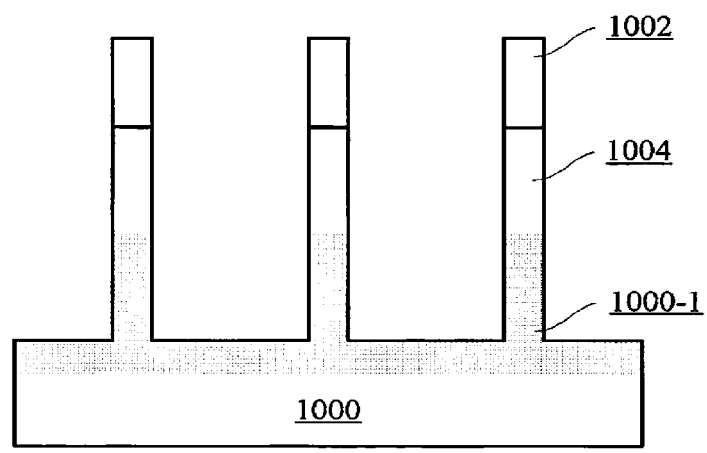

Next, the substrate 1000 may be patterned to form fin-like structures. For example, this can be done as follows. In particular, a patterned photo resist layer 1002 may be formed on the substrate 1000 according to the design. Generally, the photo resist layer 1002 may be patterned into a series of parallel equidistant lines. Then, as shown in FIG. 10, the substrate 1000 may be etched by, for example, RIE, with the patterned photo resist layer 1002 as a mask, thereby forming fin-like structures 1004. Here, the etching of the substrate may be implemented into the well region 1000-1. Subsequently, the photo resist layer 1002 may be removed.

It should be noted that trenches (between the fin-like structures 1004) formed by the etching are not necessarily in a regularly rectangular shape as shown in FIG. 10; instead, they may present a frustum shape tapered downwards. Furthermore, positions and the number of the formed fin-like structures are not limited to those shown in FIG. 10.

Furthermore, the fin-line structures are not limited to be formed by directly pattering the substrate. For example, a further semiconductor layer may be epitaxially grown on the substrate and the further semiconductor layer may be patterned to form the fin-like structures. If there is enough etching selectivity between the further semiconductor layer and the substrate, the pattering of the fin-like structures may substantially stop on the substrate, so as to control the height of the fin-like structures in a relatively accurate manner.

Thus, in the present disclosure, the expression of "forming a fin or a fin-like structure on a substrate" includes forming a fin or a fin-like structure on the substrate in any suitable manner, and the expression of "a fin or a fin-like structure formed on a substrate" includes any suitable fin or fin-like structure formed on the substrate in any suitable manner.

Figure 11:
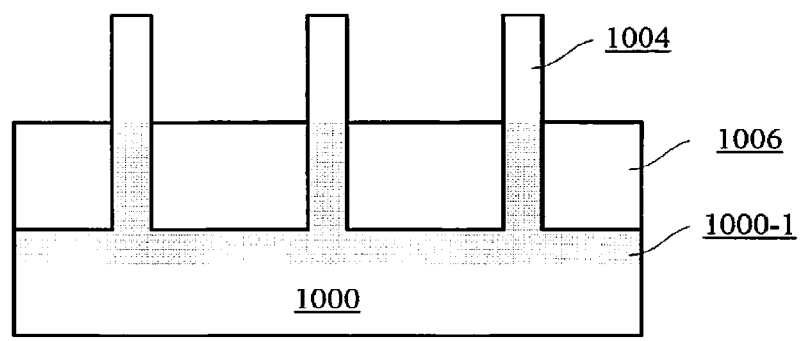

After the fin-like structures are formed by the process as mentioned above, an isolation layer may be formed on the substrate. For example, as shown in FIG. 11, a dielectric layer (including, e.g., oxide such as silicon oxide) may be formed on the substrate by deposition, and then the deposited dielectric layer may be etched back to form the isolation layer 1006. Generally, the deposited dielectric layer may completely cover the fin-like structures 1004, and may be planarized by, e.g., CMP prior to being etched back. In a case where the well region 1000-1 is formed in the substrate 1000, the isolation layer 1006 may slightly expose the well region. That is, the isolation layer 1006 may have its top surface slightly lower than that of the well region 1000-1 (with a difference therebetween in height not shown in the figures).

It should be noted that such an isolation layer is not always necessary, especially in a case where the substrate is an SOI substrate.

Figure 12:
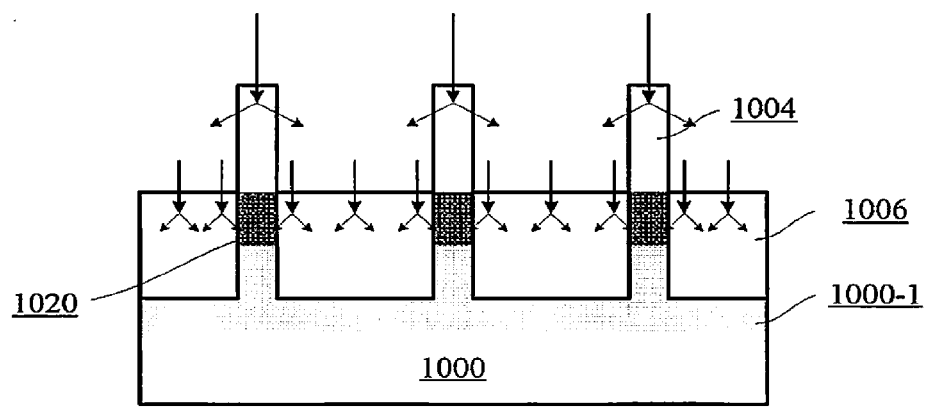

In order to improve performances of the device, especially to decrease source and drain leakage, according to an example of the present disclosure, a PTS 1020 may be formed by ion implantation, as shown by arrows in FIG. 12. For example, p-type impurities such as B, $BF_2$ or In may be implanted for an n-type device, and n-type impurities such as As or P may be implanted for a p-type device. The ion implantation may be implemented in a direction substantially perpendicular to the surface of the substrate. Parameters for the ion implantation can be controlled so that the PTS is formed in a portion of each of the fin-like structures 1004 beneath a surface of the isolation layer 1006 and has a desired doping concentration of, e.g., about 5E17-2E19 $cm^{-3}$, which is higher than that of the well region 1000-1 in the substrate. Due to the shape factor of the fin-like structures 1004 (being elongate), a portion of the dopants (ions or elements) may be scattered from exposed portions of the fin-like structures, facilitating formation of a steep doping profile in the depth direction. Annealing such as spike anneal, laser anneal and/or rapid anneal may be performed to activate the implanted dopants. Such a PTS helps to decrease the source and drain leakage.

Figure 13:
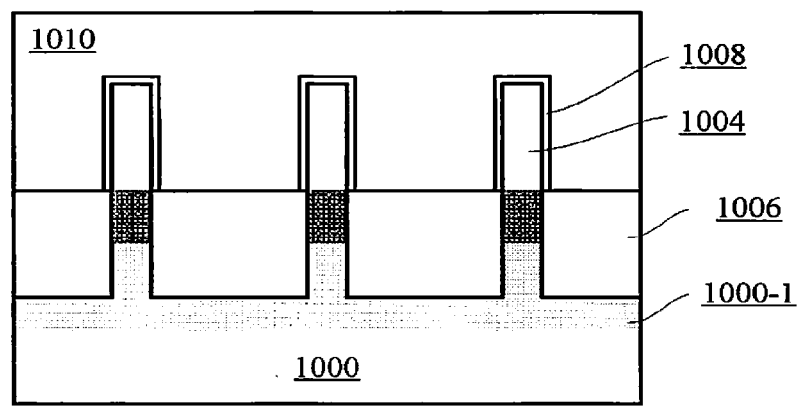

Subsequently, a gate stack intersecting with the fins may be formed on the isolation layer 1006. For example, this can be done as follows. In particular, as shown in FIG. 13, a sacrificial gate dielectric layer 1008 may be formed by, e.g., deposition. For example, the sacrificial gate dielectric layer 1008 may comprise oxide with a thickness of about 0.8-1.5 nm. In the example shown in FIG. 13, the sacrificial gate dielectric layer 1008 is shown as being in a "Π" shape. However, the sacrificial gate dielectric layer 1008 may further comprise a portion extending over the top surface of the isolation layer 1006. Afterwards, a sacrificial gate conductor layer 1010 is formed by, e.g., deposition. For example, the sacrificial gate conductor layer 1010 may comprise poly silicon. The sacrificial gate conductor layer 1010 may fill gaps between the fins and may be polarized by, e.g., CMP.

Figure 14:
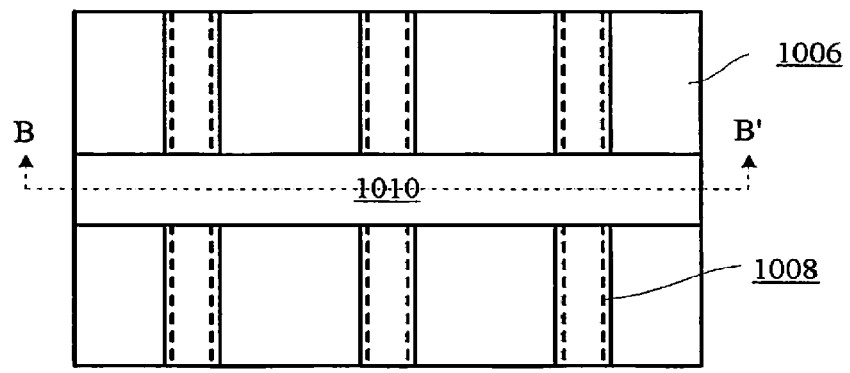

As shown in FIG. 14 (FIG. 13 corresponds to a cross sectional view along line BB' of FIG. 14), the sacrificial gate conductor layer 1010 may be patterned. In the example shown in FIG. 14, the sacrificial gate conductor layer 1010 is patterned into a strip intersecting with the fin-like structures. According to another embodiment, the sacrificial gate dielectric layer 1008 may be further patterned with the patterned sacrificial gate conductor layer 1010 as a mask.

After forming the patterned sacrificial gate conductor, halo implantation and extension implantation may be performed with the sacrificial gate conductor as a mask, for example.

Figure 15:
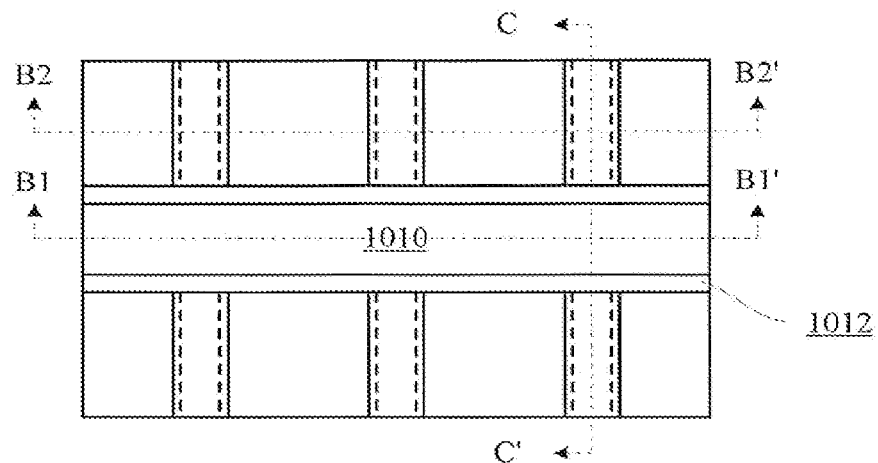

Next, as shown in FIG. 15, a gate spacer 1012 may be formed on sidewalls of the gate conductor layer 1010. For example, a nitride (e.g., silicon nitride) layer with a thickness of about 5-20 nm may be formed by deposition, and then the nitride undergoes RIE to form the gate spacer 1012. There are various ways to form such a spacer, and detailed descriptions thereof are omitted here for brevity. In a case where the trenches between the fins present a frustum shape tapered downwards (a normal case due to the characteristic of etching), the gate spacer 1012 has substantially no portion formed on sidewalls of the fins.

Figure 16:
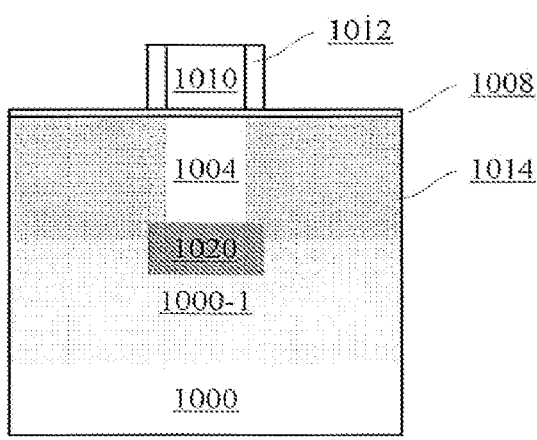
Figure 16:
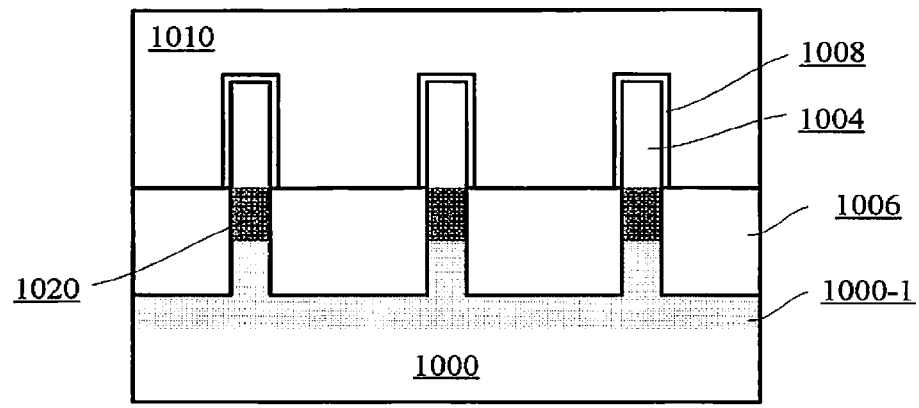
Figure 16:
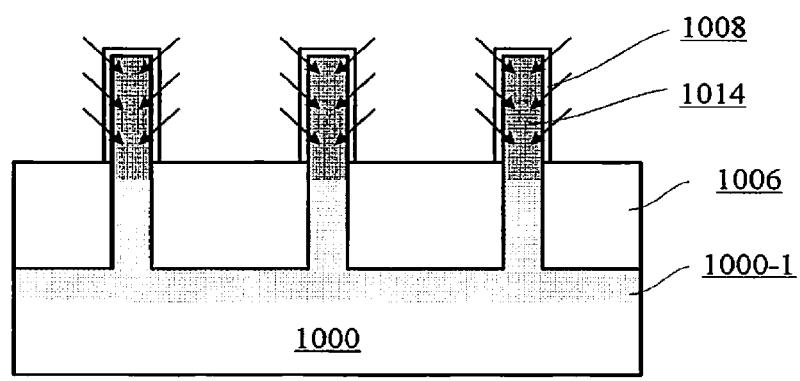

After forming the spacer, as shown in FIG. 16 (FIG. 16(a) is a cross sectional view along line B1B1' in FIG. 15, FIG. 16(b) is a cross sectional view along line B2B2' in FIG. 15, and FIG. 16(c) is a cross sectional view along line CC' in FIG. 15), source/drain (S/D) implantation may be performed with the gate conductor and the spacer as a mask. Here, angular implantation may be performed as indicated by arrows in FIG. 16(b). P-type impurities such as B, $BF_2$ or In may be implanted for a p-type device, and n-type impurities such as As or P may be implanted for an n-type device. Annealing may be performed to activate implanted ions to form source/drain regions 1014. As shown in FIG. 16(a), due to the presence of the gate stack, the S/D implantation has substantially no impact on portions of the fin-like structures 1004 intersecting with the gate stack (in which channel regions are formed).

Since the S/D implantation and the PTS have opposite types of impurities, the S/D implantation may compensate for the PTS 1020 beneath the source/drain regions 1014, to decrease the concentration of the dopants therein to about 5E16-1E19 cm$^{-3}$, for example. Thus, the PTS 1020 is substantially disposed beneath the channel region. The compensated PTS beneath the source/drain regions 1014 is not shown in the figures. Such compensation may improve the performances of the device, especially decreasing the junction capacitance between the source/drain regions and the substrate.

Figure 17:
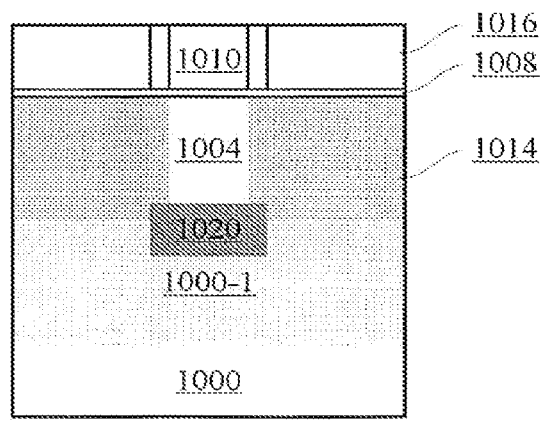

Then, as shown in FIG. 17, an interlayer dielectric layer 1016 may be formed by, e.g., deposition. For example, the interlayer dielectric layer 1016 may comprise oxide. Subsequently, the interlayer dielectric layer 1016 may be planarized by, for example, CMP. The CMP may stop at the gate spacer 1012 so as to expose the sacrificial gate stack.

Figure 18:
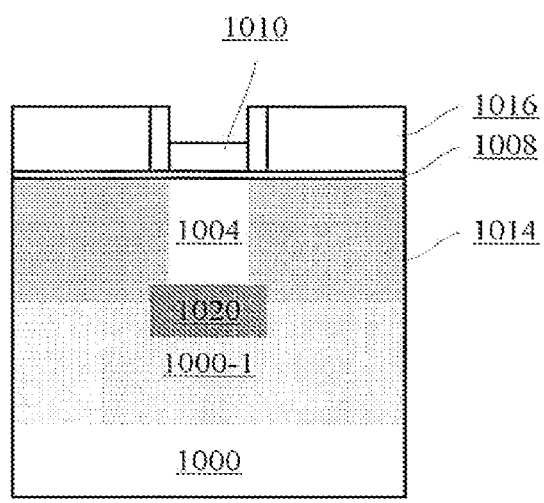

Next, as shown in FIG. 18, the sacrificial gate stack (in this example, the sacrificial gate conductor layer 1010) may be partially etched back by selective etching such as RIE. For example, the etching back may be performed to a depth of about 10 nm-60 nm. Thus, an opening is formed inside the gate spacer 1012.

Figure 19:
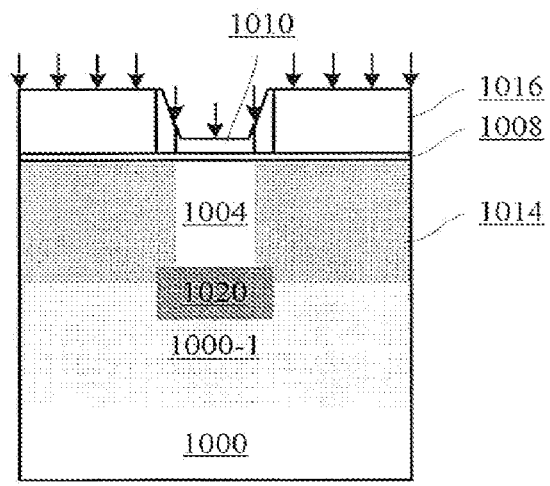

Then, as shown in FIG. 19 (referring to arrows shown in the figure), atom and/or ion bombardment, such as plasma sputtering, may be performed on a top surface of the structure as shown in FIG. 18 to expand the opening. For example, plasma such as Ar, N or the like can be used for bombardment. Referring to the above descriptions in conjunction with FIG. 3, the gate spacer may have at least an upper portion of its surface inclined, so that the inclined portion of the surface defines a space tapered downwards. When the bombardment is implemented in a substantially vertical direction, the expanded opening may be self-aligned to a remaining portion of the sacrificial gate stack.

Figure 20:
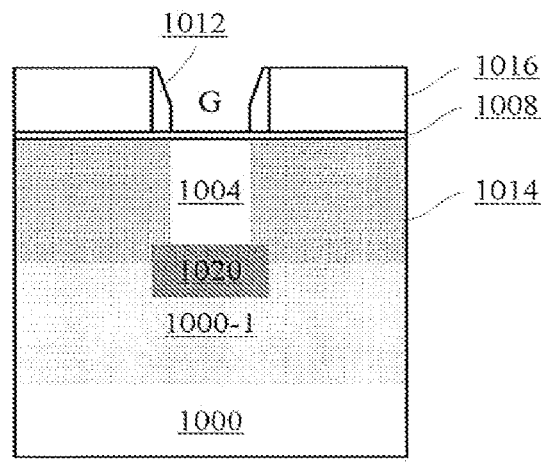

Then as shown in FIG. 20, the remaining portion of the gate stack (including a remaining portion of the sacrificial gate conductor layer 1010 and the sacrificial gate dielectric layer 1008) may be further removed by selective etching, such as RIE. Thus, a space G (also referred to as "gate trench") defined by the gate spacer 1012 is left inside the gate spacer 1012. The gate trench G is similar to the gate trench described above by referring to FIG. 4.

Then, as shown in FIG. 21, a gate stack including a gate dielectric layer 1022 and a gate conductor layer 1024 may be filled into the gate trench G. For more details, reference may be made to the above descriptions in conjunction with FIG. 5.

Figure 22:
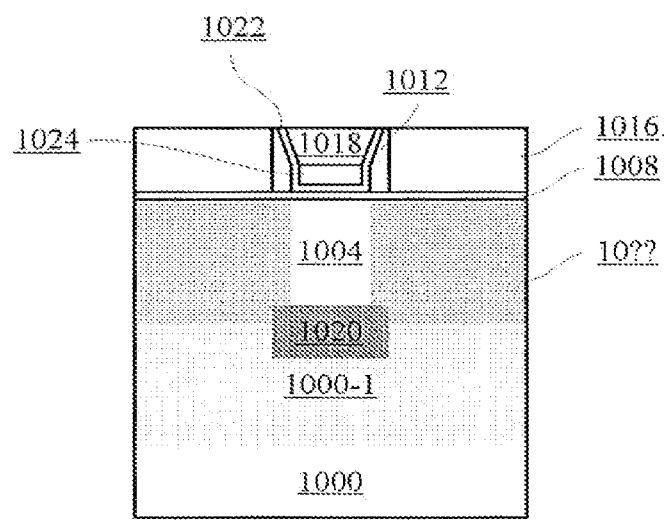
FIG. 22 is a schematic view showing a semiconductor device according to a still further embodiment of the present disclosure.

According to another example of the present disclosure, as shown FIG. 22, the gate conductor layer 1024 may be further partially etched back, and a dielectric layer 1018 (e.g., nitride) may be filled on top thereof. Reference may be made to the above descriptions in conjunction with FIG. 6 and FIG. 7.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

The invention claimed is:

1. A method for manufacturing a semiconductor device, comprising:
    forming a sacrificial gate stack on a substrate;
    forming a gate spacer on sidewalls of the sacrificial gate stack;
    forming an interlayer dielectric layer on the substrate and planarizing it to expose the sacrificial gate stack;
    partially etching back the sacrificial gate stack to form an opening by selective etching, wherein the gate spacer remains unetched;
    expanding the opening so that the opening is in a shape whose size gradually increases from a side adjacent to the substrate towards an opposite side away from the substrate; and
    removing a remaining portion of the sacrificial gate stack and forming a gate stack in a space defined by the gate spacer.

2. The method according to claim 1, wherein the expanding comprises performing atom and/or ion bombardment.

3. The method according to claim 2, wherein the atom and/or ion bombardment comprises plasma sputtering.

4. The method according to claim 1, wherein the expanded opening is self-aligned to the remaining portion of the sacrificial gate stack.

5. The method according to claim 1, wherein the gate stack comprises a gate dielectric layer and a gate conductor layer, and wherein the method further comprises:
    partially etching back the gate conductor layer;
    forming an dielectric layer on the gate conductor layer to cover the etched back gate conductor layer; and
    forming contacts in the interlayer dielectric layer so that the contacts are in a shape whose size gradually increases from a side adjacent to the substrate towards an opposite side away from the substrate.

* * * * *